United States Patent
Ramos et al.

(10) Patent No.: US 9,226,073 B2
(45) Date of Patent: Dec. 29, 2015

(54) AUDIO OUTPUT BALANCING DURING SYNCHRONIZED PLAYBACK

(71) Applicant: Sonos, Inc., Santa Barbara, CA (US)

(72) Inventors: Aurelio Rafael Ramos, Jamaica Plain, MA (US); Timothy W. Sheen, Brighton, MA (US)

(73) Assignee: Sonos, Inc., Santa Barbara, CA (US)

( * ) Notice: Subject to any disclaimer, the term of this patent is extended or adjusted under 35 U.S.C. 154(b) by 100 days.

(21) Appl. No.: 14/174,253

(22) Filed: Feb. 6, 2014

(65) Prior Publication Data

US 2015/0222993 A1 Aug. 6, 2015

(51) Int. Cl.
| | |
|---|---|
| *H03G 5/00* | (2006.01) |
| *H04R 3/14* | (2006.01) |
| *H04R 3/04* | (2006.01) |
| *H04R 11/00* | (2006.01) |
| *H03G 3/00* | (2006.01) |
| *H04R 27/00* | (2006.01) |

(52) U.S. Cl.
CPC ................. *H04R 3/14* (2013.01); *H03G 3/001* (2013.01); *H04R 3/04* (2013.01); *H04R 11/00* (2013.01); *H04R 27/00* (2013.01)

(58) Field of Classification Search
None
See application file for complete search history.

(56) References Cited

U.S. PATENT DOCUMENTS

| | | | |
|---|---|---|---|
| 5,182,552 | A | 1/1993 | Paynting |
| 5,553,147 | A | 9/1996 | Pineau |
| 5,668,884 | A | 9/1997 | Clair, Jr. et al. |
| 5,673,323 | A | 9/1997 | Schotz et al. |
| 5,923,902 | A | 7/1999 | Inagaki |
| 5,946,343 | A | 8/1999 | Schotz et al. |
| 6,256,554 | B1 | 7/2001 | DiLorenzo |
| 6,404,811 | B1 | 6/2002 | Cvetko et al. |
| 6,522,886 | B1 | 2/2003 | Youngs et al. |
| 6,611,537 | B1 | 8/2003 | Edens et al. |
| 6,631,410 | B1 | 10/2003 | Kowalski et al. |

(Continued)

FOREIGN PATENT DOCUMENTS

| | | |
|---|---|---|
| WO | 0153994 | 7/2001 |
| WO | 2005013047 A2 | 2/2005 |

(Continued)

OTHER PUBLICATIONS

"Bluetooth. "Specification of the Bluetooth System: The ad hoc SCATTERNET for affordable and highly functional wireless connectivity" Core, Version 1.0 A, Jul. 26, 1999, 1068 pages".

(Continued)

*Primary Examiner* — Muhammad N Edun
(74) *Attorney, Agent, or Firm* — McDonnell Boehnen Hulbert & Berghoff LLP

(57) ABSTRACT

Systems and method are provided herein for balancing of outputs from playback devices playing audio content in synchrony. In one embodiment, the balancing of outputs may involve receiving a first audio signal to be played by a first playback device according to a first crossover frequency, determining a limiting result by applying a limiting function associated with a second playback device to a second audio signal to be played by the second playback device according to a second crossover frequency, and based on the first limiting result, configuring the first playback device to play the first audio signal according to a third crossover frequency. In some cases, the first and second playback devices may be configured to play the first and second audio signals, respectively, in synchrony.

23 Claims, 13 Drawing Sheets

(56) References Cited

U.S. PATENT DOCUMENTS

| | | |
|---|---|---|
| 6,757,517 B2 | 6/2004 | Chang |
| 6,778,869 B2 | 8/2004 | Champion |
| 6,916,980 B2 | 7/2005 | Ishida et al. |
| 6,931,134 B1 | 8/2005 | Waller, Jr. et al. |
| 7,130,608 B2 | 10/2006 | Hollstrom et al. |
| 7,130,616 B2 | 10/2006 | Janik |
| 7,143,939 B2 | 12/2006 | Henzerling |
| 7,171,010 B2 | 1/2007 | Martin et al. |
| 7,187,947 B1 | 3/2007 | White et al. |
| 7,218,708 B2 | 5/2007 | Berezowski et al. |
| 7,236,773 B2 | 6/2007 | Thomas |
| 7,483,538 B2 | 1/2009 | McCarty et al. |
| 7,539,551 B2 | 5/2009 | Komura et al. |
| 7,558,224 B1 | 7/2009 | Surazski et al. |
| 7,571,014 B1 | 8/2009 | Lambourne et al. |
| 7,643,894 B2 | 1/2010 | Braithwaite et al. |
| 7,657,910 B1 | 2/2010 | McAulay et al. |
| 7,668,990 B2 | 2/2010 | Krzyzanowski et al. |
| 7,689,305 B2 | 3/2010 | Kreifeldt et al. |
| 7,742,832 B1 | 6/2010 | Feldman et al. |
| 7,792,311 B1 | 9/2010 | Holmgren et al. |
| 7,805,210 B2 | 9/2010 | Cucos et al. |
| 7,853,341 B2 | 12/2010 | McCarty et al. |
| 8,014,423 B2 | 9/2011 | Thaler et al. |
| 8,045,952 B2 | 10/2011 | Qureshey et al. |
| 8,103,009 B2 | 1/2012 | McCarty et al. |
| 8,234,395 B2 | 7/2012 | Millington |
| 8,239,559 B2 | 8/2012 | Rajapakse |
| 8,290,603 B1 | 10/2012 | Lambourne |
| 2001/0042107 A1 | 11/2001 | Palm |
| 2002/0002039 A1 | 1/2002 | Qureshey et al. |
| 2002/0003548 A1 | 1/2002 | Krusche et al. |
| 2002/0022453 A1 | 2/2002 | Balog et al. |
| 2002/0026442 A1 | 2/2002 | Lipscomb et al. |
| 2002/0072816 A1 | 6/2002 | Shdema et al. |
| 2002/0078161 A1 | 6/2002 | Cheng |
| 2002/0124097 A1 | 9/2002 | Isely et al. |
| 2003/0002689 A1 | 1/2003 | Folio |
| 2003/0020763 A1 | 1/2003 | Mayer et al. |
| 2003/0157951 A1 | 8/2003 | Hasty |
| 2003/0161479 A1 | 8/2003 | Yang et al. |
| 2004/0010727 A1 | 1/2004 | Fujinami |
| 2004/0015252 A1 | 1/2004 | Aiso et al. |
| 2004/0024478 A1 | 2/2004 | Hans et al. |
| 2004/0131192 A1 | 7/2004 | Metcalf |
| 2004/0223622 A1 | 11/2004 | Lindemann et al. |
| 2005/0131558 A1 | 6/2005 | Braithwaite et al. |
| 2005/0147261 A1 | 7/2005 | Yeh |
| 2005/0289224 A1 | 12/2005 | Deslippe et al. |
| 2006/0149402 A1 | 7/2006 | Chung |
| 2006/0193482 A1 | 8/2006 | Harvey et al. |
| 2007/0003067 A1 | 1/2007 | Gierl et al. |
| 2007/0071255 A1 | 3/2007 | Schobben |
| 2007/0142022 A1 | 6/2007 | Madonna et al. |
| 2007/0142944 A1 | 6/2007 | Goldberg et al. |
| 2008/0045140 A1 | 2/2008 | Korhonen |
| 2008/0077261 A1 | 3/2008 | Baudino et al. |
| 2008/0144861 A1 | 6/2008 | Melanson et al. |
| 2008/0144864 A1 | 6/2008 | Huon |
| 2008/0152165 A1 | 6/2008 | Zacchi |
| 2010/0067716 A1 | 3/2010 | Katayama |
| 2010/0290643 A1* | 11/2010 | Mihelich et al. ............ 381/99 |
| 2011/0044476 A1 | 2/2011 | Burlingame et al. |
| 2011/0110533 A1* | 5/2011 | Choi et al. ............ 381/99 |
| 2011/0299696 A1 | 12/2011 | Holmgren et al. |
| 2012/0096125 A1 | 4/2012 | Kallai et al. |
| 2012/0148075 A1 | 6/2012 | Goh et al. |
| 2013/0022221 A1 | 1/2013 | Kallai et al. |
| 2013/0129122 A1 | 5/2013 | Johnson et al. |

FOREIGN PATENT DOCUMENTS

| | | |
|---|---|---|
| WO | 2012137190 A1 | 10/2012 |
| WO | 2013012582 A1 | 1/2013 |

OTHER PUBLICATIONS

"Bluetooth. "Specification of the Bluetooth System: Wireless connections made easy" Core, Version 1.0 B, Dec. 1, 1999, 1076 pages".
"Dell, Inc. "Dell Digital Audio Receiver: Reference Guide" Jun. 2000, 70 pages".
"Dell, Inc. "Start Here" Jun. 2000, 2 pages".
"Jones, Stephen. "Dell Digital Audio Receiver: Digital upgrade for your analog stereo" Analog Stereo. Jun. 24, 2000 <http://www.reviewsonline.com/articles/961906864.htm> retrieved Jun. 18, 2014, 2 pages".
"Louderback, Jim. "Affordable Audio Receiver Furnishes Homes With MP3" TechTV Vault. Jun. 28, 2000 <http://www.g4tv.com/articles/17923/affordable-audio-receiver-furnishes-homes-with-mp3/> retrieved Jul. 10, 2014, 2 pages".
"Palm, Inc. "Handbook for the Palm VII Handheld" May 2000, 311 pages".
"Presentations at WinHEC 2000" May 2000, 138 pages.
"AudioTron Quick Start Guide, Version 1.0", Voyetra Turtle Beach, Inc., Mar. 2001, 24 pages.
"AudioTron Reference Manual, Version 3.0", Voyetra Turtle Beach, Inc., May 2002, 70 pages.
"AudioTron Setup Guide, Version 3.0", Voyetra Turtle Beach, Inc., May 2002, 38 pages.
Co-pending U.S. Appl. No. 13/083,499, filed Apr. 8, 2011.
Jo J., et al., "Synchronized One-to-many Media Streaming with Adaptive Playout Control," Proceedings of SPIE, 2002, vol. 4861, pp. 71-82.
Mills D.L., "Network Time Protocol (Version 3) Specification, Implementation and Analysis," Network Working Group, Mar. 1992, <http://www.ietf.org/rfc/rfc1305.txt>.
"Polycom Conference Composer manual: copyright 2001".
"UPnP; "Universal Plug and Play Device Architecture"; Jun. 8, 2000; version 1.0; Microsoft Corporation; pp. 1-54".
"Yamaha DME 32 manual: copyright 2001".
"Advisory Action mailed on Oct. 5, 2015, issued in connection with U.S. Appl. No. 13/458,558, filed Apr. 27, 2012, 4 pages".
"Corrected Notice of Allowance mailed on Mar. 12, 2015, issued in connection with U.S. Appl. No. 13/630,565, filed Sep. 28, 2012, 4 pages".
"Final Office Action mailed on Jul. 2, 2015, issued in connection with U.S. Appl. No. 13/458,558, filed Apr. 27, 2012, 11 pages".
"Non-Final Office Action mailed on Dec. 22, 2014, issued in connection with U.S. Appl. No. 13/458,558, filed Apr. 27, 2012, 11 pages".
"Non-Final Office Action mailed on Sep. 23, 2014, issued in connection with U.S. Appl. No. 13/630,565, filed Sep. 28, 2012, 7 pages".
"Non-Final Office Action mailed on Jul. 15, 2015, issued in connection with U.S. Appl. No. 14/174,253, filed Feb. 6, 2014, 9 pages".
"Non-Final Office Action mailed on Jul. 7, 2015, issued in connection with U.S. Appl. No. 14/174,244, filed Feb. 6, 2014, 9 pages".
"Notice of Allowance mailed on Jan. 22, 2015, issued in connection with U.S. Appl. No. 13/630,565, filed Sep. 28, 2012, 7 pages".
"U.S. Appl. No. 13/083,499, filed Apr. 8, 2011, "Multi-Channel Pairing in a Media System.""".

\* cited by examiner

AUDIO OUTPUT BALANCING DURING SYNCHRONIZED PLAYBACK

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were severely limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from virtually unlimited sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

Figure 1:
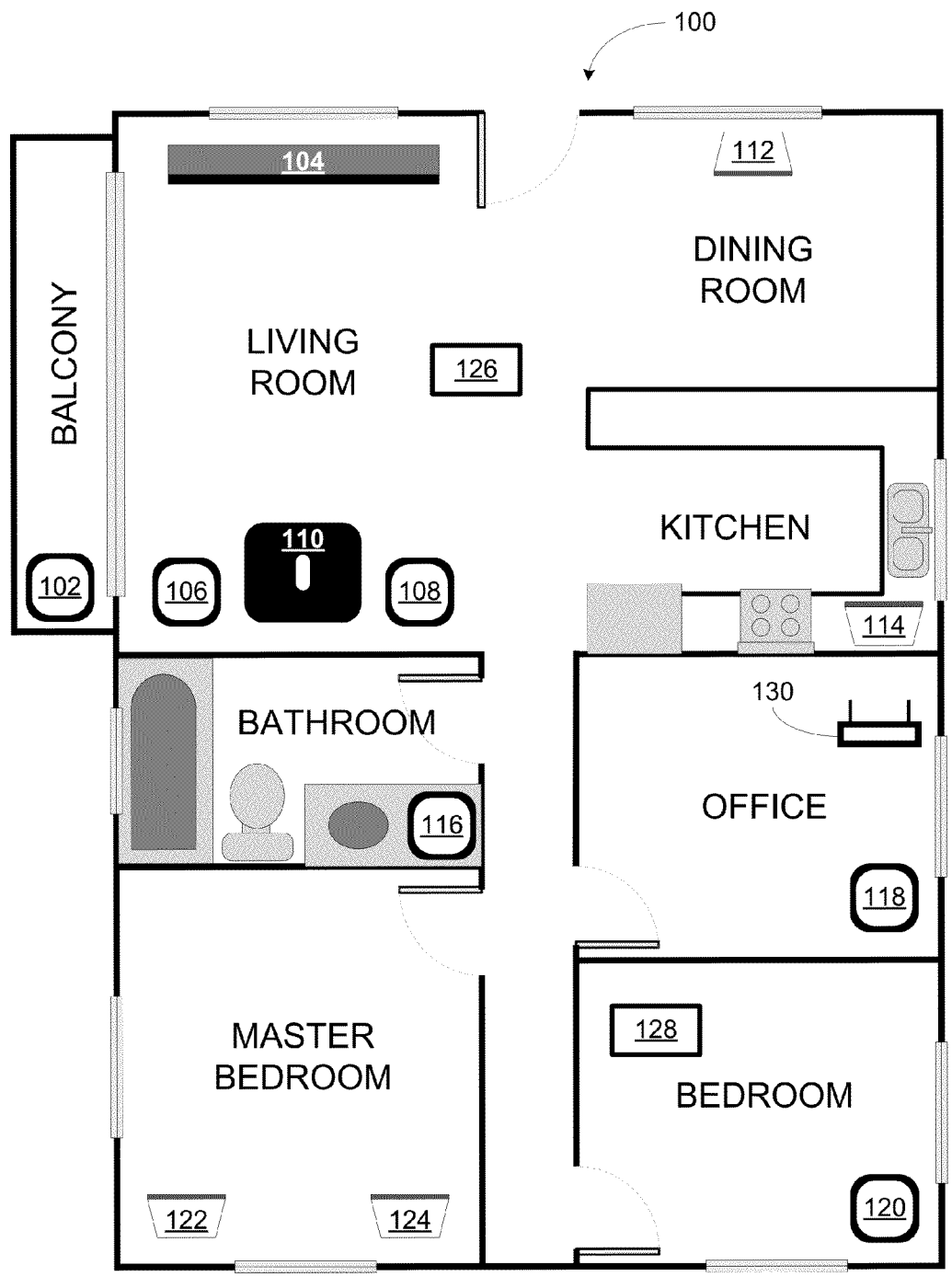
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Embodiments described herein involve balancing of outputs from playback devices playing audio content in synchrony. The playback devices may be two or more playback devices of a media playback system that have been configured as a synchrony group (two or more playback devices configured to play audio content in synchrony), stereo paired playback devices, a consolidated player, or any combination thereof. Discussions of example media playback systems, example playback devices, and example configurations of playback devices of the media playback system may be found below in sections II.a.-II.d.

Typically, playback devices of the media system have acoustic limits. Acoustic limits of a playback device may be generally described as a maximum playback volume of the playback device before the acoustic output quality of the playback device begins to deteriorate. The acoustic limit of a playback device may vary over an audio playback frequency range of the playback device. In discussions herein, an acoustic limit of a playback device may also account for electric limits or other operational limits of the playback device. Accordingly, a limiter may be implemented on the playback device to attenuate input signals above a playback volume threshold such that the output of the playback device is capped at a certain volume level, thereby improving the acoustic output quality of the playback device. In one example, an amplifier gain control of the playback device may be implemented as the limiter. In such a case, a gain value of the playback device may be capped such that an input signal is not amplified beyond the playback volume threshold of the playback device. The limiter may be a dynamic limiter such that the gain value cap may be dynamically adjusted according to amplitudes of the input audio signal. Other example limiter implementations may also be possible.

In one example configuration for audio content playback, two playback devices may be configured as a stereo pair. In one case, the playback devices of a stereo pair may have different acoustic limits, and may therefore have different limiters implemented thereon. For instance, a left channel playback device of the stereo pair may have a higher playback volume threshold than a right channel playback device of the stereo pair. This may be, for example, because the left channel playback device and the right channel playback device have different audio amplifier and/or different transducer configurations and specifications. As a result of the different limiters, the output volume from the left channel playback device and the right channel playback device may become mismatched when a playback volume of the stereo pair is beyond the playback volume threshold one of the respective playback devices. In some cases, even if the left channel playback device and the right channel playback device have the same (or substantially the same) audio amplifier and transducer configurations and specifications (i.e. the playback devices are the same production model), and therefore having comparable acoustic limits and limiters implemented thereon, the left and right channel audio components of audio content to be rendered by the stereo pair may be sufficiently mismatched in volume such that one of the playback devices may still reach a limit before the other playback device.

In one example embodiment of the present application, the left channel playback device of the two stereo paired playback devices may be configured to receive both the left channel audio component and the right channel audio component. In one case, the left channel playback device may have access to the limiter for the right channel playback device. As such, the left channel playback device may apply the limiter for the right channel playback device to the right channel audio component. The left channel playback device may then determine a limiter based on a result of applying the right channel playback device limiter to the right channel audio component. In this case, the determined limiter may correlate to the acoustic limit of the right channel playback device. As such, the left channel playback device may apply the determined limiter when playing the left channel audio component while the right channel playback device renders the right channel audio component to achieve a balanced output from the stereo pair.

In another example audio content playback configuration, playback devices of a consolidated player may have different acoustic limits, and may therefore have different limiters implemented thereon. In one case, the consolidated player may include a mid-high frequency range playback device configured to render a mid-high frequency range audio component, and a low frequency range playback device (i.e. a subwoofer) configured to render a low frequency audio component. The mid-high frequency range audio component may have a first crossover frequency and the low frequency audio component may have a second crossover frequency. In some cases, the first and second crossover frequencies may be the same frequency.

In this example, the low frequency range playback device may have a higher acoustic limit than an acoustic limit of the mid-high frequency range playback device. Accordingly, the low frequency range playback device may have a playback volume threshold higher than that of the mid-high frequency range playback device. As a result of the different limiters, the low frequency output volume of the consolidated player and the mid-high frequency output volume of the consolidated player may become mismatched when the playback volume of the consolidated player is beyond the playback volume threshold of the mid-high frequency range playback device.

In one example embodiment of the present application, one or more of the playback devices of the consolidated player may receive a plurality of audio components, including audio components to be rendered by the playback device as well as audio components to be rendered by a different playback device. As one example, the low frequency range playback device may be configured to receive the low frequency audio component to be rendered by the low frequency range playback device as well as the mid-high frequency audio component to be rendered by the mid-high frequency range playback device. In one case, the low frequency range playback device may have access to the limiter for the mid-high frequency range playback device. As such, the low frequency range playback device may apply the limiter for the mid-high frequency range playback device to the mid-high frequency audio component to determine a first limiting result, and apply the limiter for the low frequency range playback device to the low frequency audio component to determine a second limiting result. In one example, determining the first limiting result may involve generating a model limited mid-high frequency audio signal by applying the limiter for the mid-high frequency range playback device to the mid-high frequency audio component. Similarly, determining the second limiting result may involve generating a model limited low frequency audio signal by applying the limiter for the low frequency range playback device to the low frequency audio component.

Based on the first and second limiting results, the low frequency range audio playback device may determine a limiter to apply to the low frequency audio component when rendering the low frequency audio component in synchrony with playback of the mid-high frequency audio component by the mid-high frequency range playback device as a consolidated player to achieve a balanced output across the audio frequency spectrum.

In another example embodiment, the acoustic limit of the mid-high frequency range playback device of a consolidated player may be lower towards the lower end of the mid-high frequency playback range than other playback frequency ranges of the mid-high frequency range playback device. In other words, the acoustic limit towards the lower end of the mid-high frequency playback range may become the limiting factor when applying the limiter of the mid-high frequency range playback device to the mid-high frequency audio component.

In such a scenario, if the low-frequency range playback device of the consolidated player is capable of playing frequencies in the lower end of the mid-high frequency playback range of the mid-high frequency range playback device at a higher acoustic limit, the crossover frequency for playing the low-frequency audio signal on the low-frequency range playback device may be shifted to a higher frequency. Also, the crossover frequency for playing the mid-high frequency audio signal on the mid-high frequency range playback device may also be shifted to a higher frequency. In other words, audio content within a frequency range towards the lower end of the mid-high frequency playback range may be played by the low frequency range playback device, rather than the mid-high frequency range playback device. Accordingly, in some cases, applying the limiter for the mid-high frequency range playback device to the modified mid-high frequency component may result in a less limited playback of the mid-high frequency audio component by the mid-high frequency range playback device, and the balanced output of the consolidated player may have a higher volume.

While the above example embodiments generally involve two playback devices as a either a stereo pair or consolidated player, one having ordinary in the art will appreciate that concepts within the example embodiments may be extended to any number of playback devices in a media playback system configured as any one or more of a synchrony group, stereo paired playback devices, or a consolidated player. In addition, while the above example embodiments describe certain grouped players (e.g., a left player in a stereo pair or a low frequency-range playback device in a consolidated player) performing various functions, it should be understood that other players in the group could perform these functions as well.

As indicated above, the present application involves balancing of outputs from playback devices playing audio content in synchrony. In one aspect, a first playback device is provided. The first playback device includes a processor, and memory having stored thereon instructions executable by the processor to cause the first playback device to perform functions. The functions include receiving a first audio signal. The first playback device is configured to play the first audio signal according to a first crossover frequency. The functions also include determining a first limiting result by applying a limiting function to a second audio signal. The second audio signal is configured for playback by a second playback device according to a second crossover frequency, and the limiting function is associated with the second playback device. The functions further include, based on the first limiting result, configuring the first playback device to play the first audio signal according to a third crossover frequency.

In another aspect, a method is provided. The method involves receiving, by a first playback device, audio content comprising a first audio signal and a second audio signal. The first playback device is configured to play the first audio signal according to a first crossover frequency in synchrony with the playback of the second audio signal according to a second crossover frequency by a second playback device. The method also involves determining a first limiting result by applying, by the first playback device, a first limiting function to the first audio signal. The first limiting function is associated with the first playback device. The method further involves determining a second limiting result by applying, by the first playback device, a second limiting function to the second audio signal. The second limiting function is associated with the second playback device. The method also involves, based on the first limiting result and the second limiting result, configuring the first playback device to play the first audio signal according to a third crossover frequency.

In yet another aspect, a non-transitory computer readable memory is provided. The non-transitory computer readable memory has stored thereon instructions executable by a computing device to cause the computing device to perform functions. The functions include receiving a first audio signal. The first playback device is configured to play the first audio signal according to a first crossover frequency. The functions also include determining a first limiting result by applying a limiting function to a second audio signal. The second audio signal is configured for playback by a second playback device according to a second crossover frequency, and the limiting function is associated with the second playback device. The functions further include, based on the first limiting result, configuring the first playback device to play the first audio signal according to a third crossover frequency.

It will be understood by one of ordinary skill in the art that this disclosure includes numerous other embodiments.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
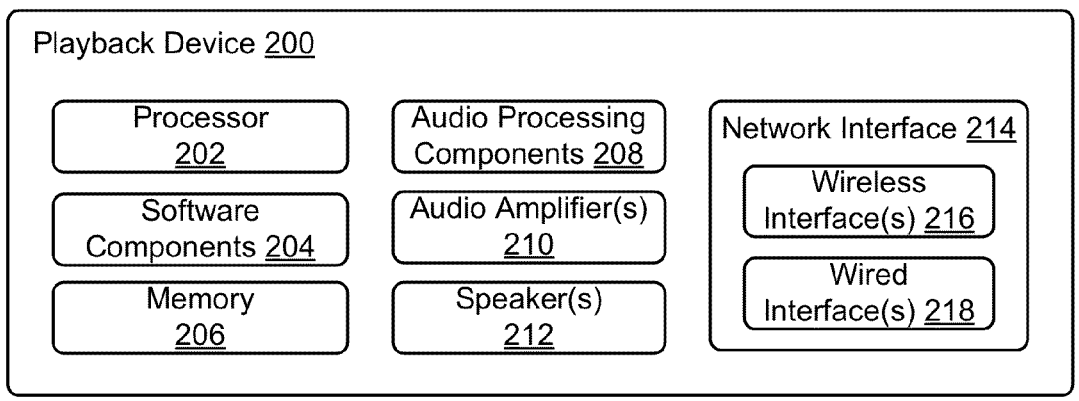
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11 ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
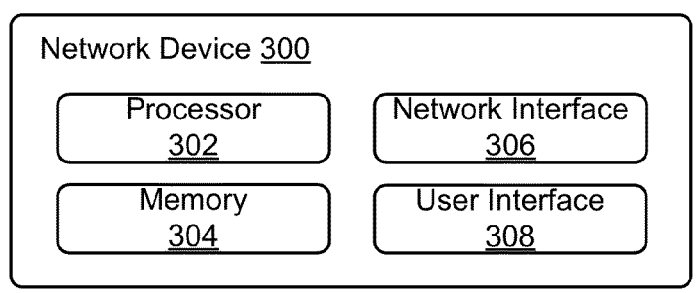
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
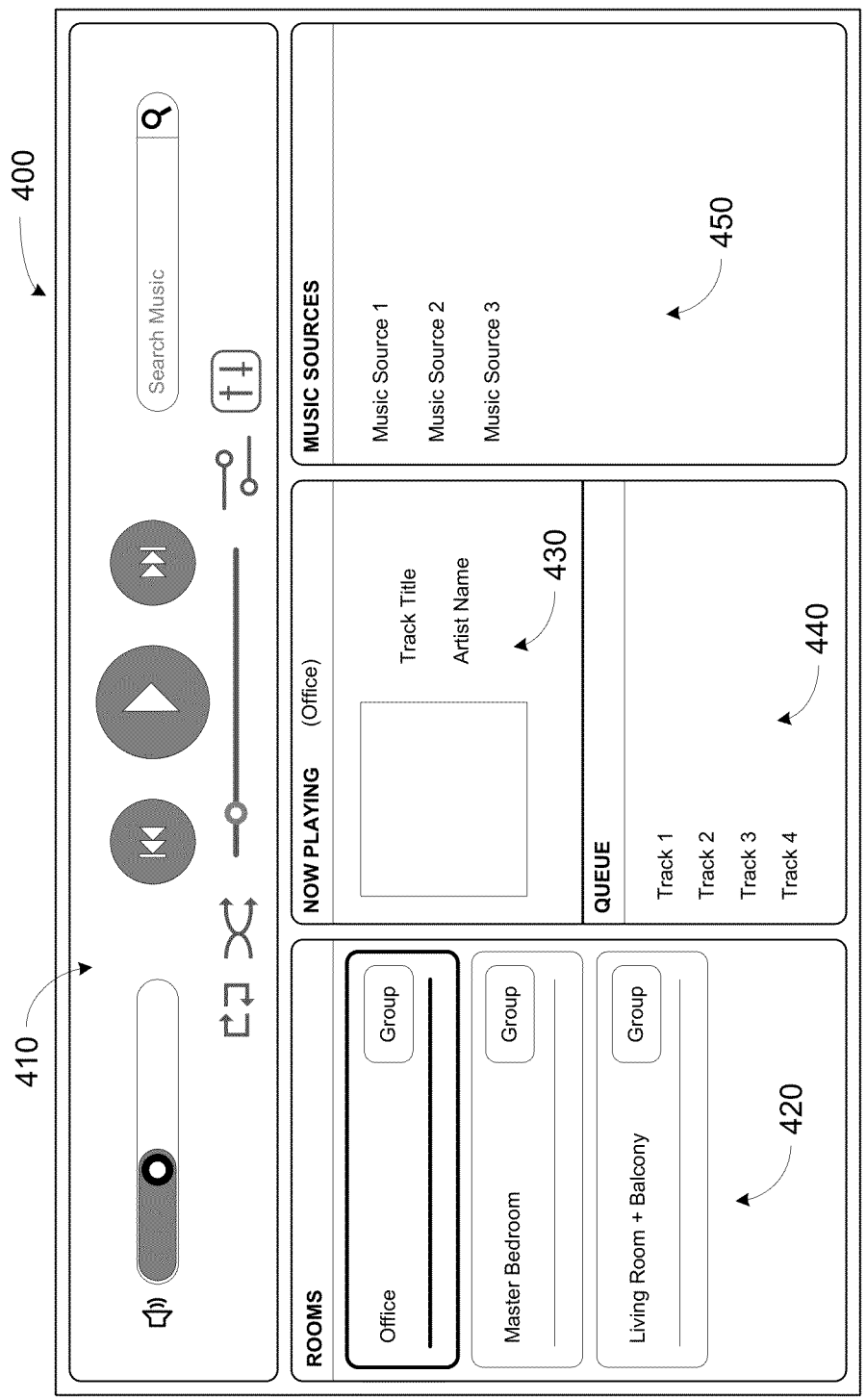
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

Figure 5:
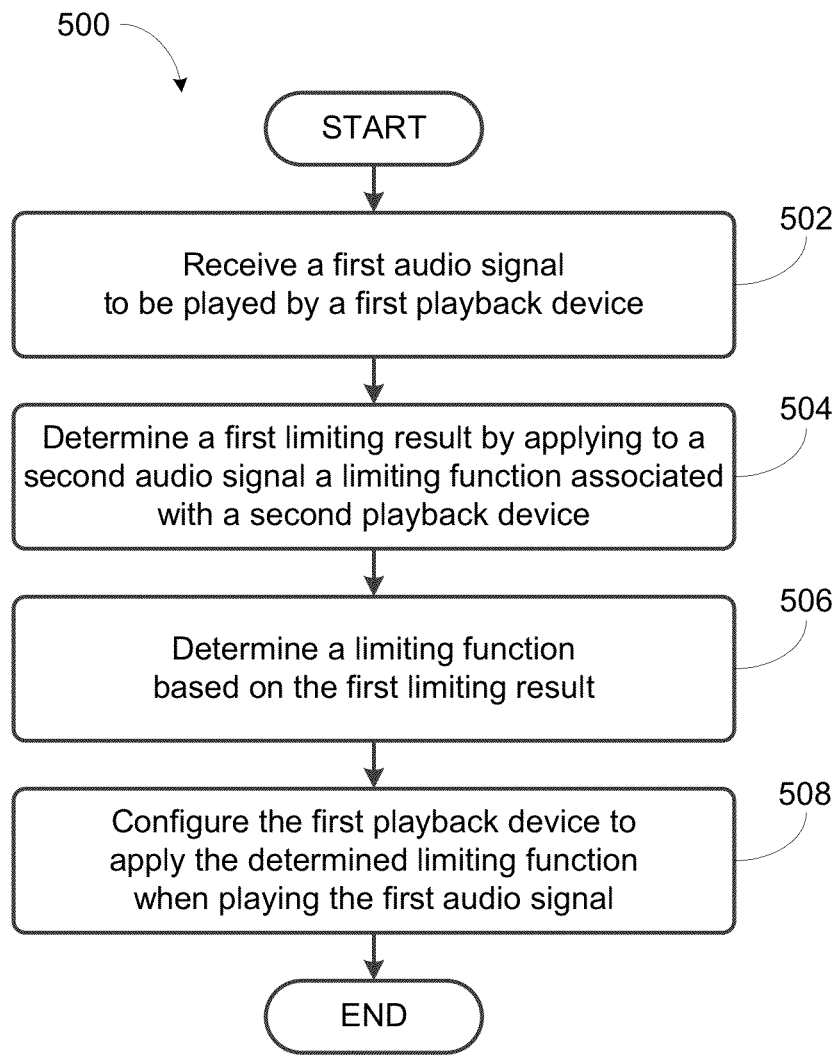
FIG. 5 shows a flow diagram of a first example method for audio output balancing during synchronized playback.

III. Example Methods for Audio Output Balancing During Synchronized Playback As discussed above, embodiments described herein may involve balancing of outputs from playback devices playing audio content in synchrony.

a. First Example Method for Audio Output Balancing During Synchronized Playback FIG. 5 shows a flow diagram of a first example method for audio output balancing during synchronized playback. Method 500 shown in FIG. 5 presents an embodiment of a method that can be implemented within an operating environment involving, for example, the media playback system 100 of FIG. 1, one or more of the playback device 200 of FIG. 2, and one or more of the control device 300 of FIG. 3. Method 500 may include one or more operations, functions, or actions as illustrated by one or more of blocks 502-508. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the method 500 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 500 and other processes and methods disclosed herein, each block in FIG. 5 may represent circuitry that is wired to perform the specific logical functions in the process.

Figure 6A:
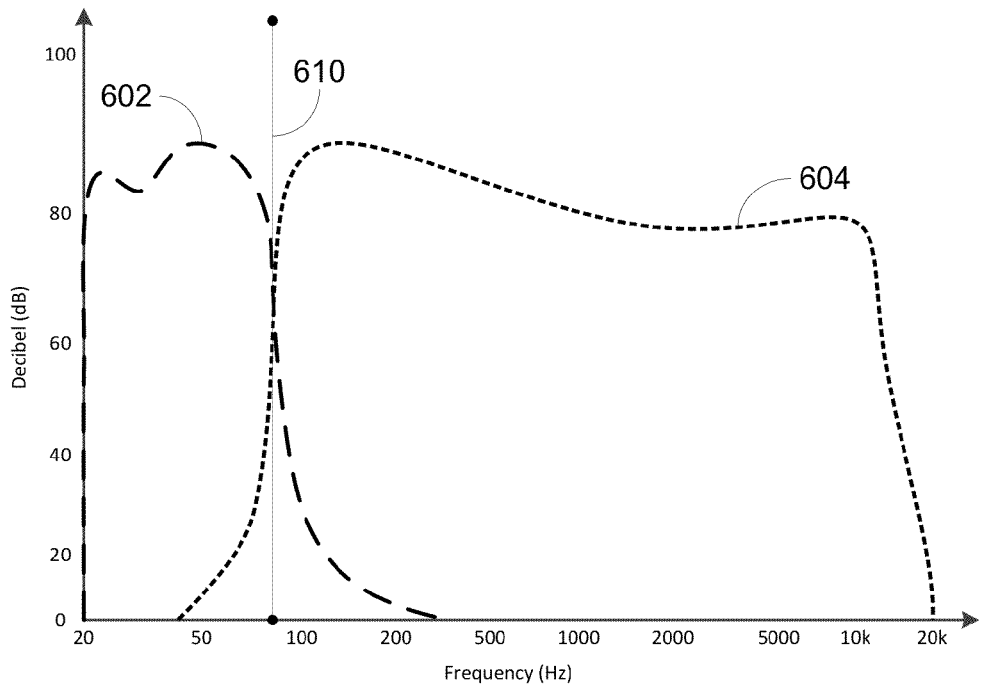
FIGS. 6A-6D show example synchronized playback audio signals, example audio limiters, and example limited audio signals.

At block 502, the method 500 involves receiving a first audio signal to be played by a first playback device. In one example, the first playback device may be configured to play the first audio signal in synchrony with the playback of a second audio signal by a second playback device. FIG. 6A shows a first example pair of synchronized playback audio signals 602 and 604. In this example, audio signal 602 may be the first audio signal and may include audio content within a first example frequency range of approximately 20 Hz to 80 Hz. As such, a crossover frequency for audio signal 602 may be 80 Hz. Audio signal 604 may be the second audio signal and may include audio content with a second example frequency range of approximately 80 Hz to 20 kHz. In this example, audio signal 602 may also have a crossover frequency of 80 Hz.

In this case, the first and second playback devices may be configured as a consolidated player, and the audio signal 602 may be the first audio signal to be played by the first playback device while the audio signal 604 may be the second audio signal to be played by the second playback device. In such a case, the first playback device may be a playback device configured for playing low frequency audio content (i.e., a subwoofer), and the second playback device may be a playback device configured to play a full frequency range or mid-high frequency range of audio content. For purposes of illustration, the first and second playback devices may be playback devices 104 and 110, respectively, as shown in FIG. 1.

Figure 6B:
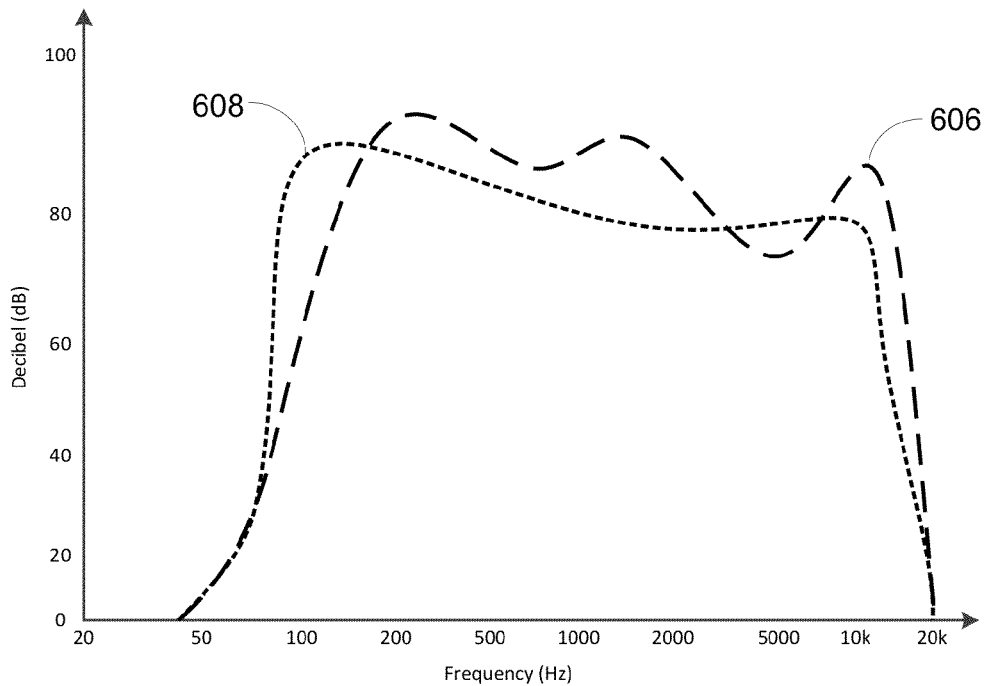

FIG. 6B shows a second example pair of synchronized playback audio signals 606 and 608. In this example, audio signal 608 may be the first audio signal and may include left channel components of a stereo audio content, while audio signal 606 may be the second audio signal and may include right channel components of the stereo audio content. In this case, the first and second playback devices may be configured as a stereo pair such that the first playback device is configured as a left channel speaker for playing the audio signal 608 while the second playback device is configured as a right channel speaker for playing the audio signal 606. For purposes of illustration, the first and second playback devices in this case may be the playback devices 124 and 122, respectively, as shown in FIG. 1.

In one case, the first playback device in the consolidated player or stereo pair may be a primary player configured to receive audio signals and send the audio signals to other playback devices within the consolidated player or stereo pair for playback. As such, in one example, the first audio signal and the second audio signal may be received by the first playback device. For instance, in connection with FIG. 6A, the audio signals 602 and 604 may be received by a low frequency range playback device of the consolidated player, and in connection with FIG. 6B, the audio signals 606 and 608 may be received by the left channel speaker of the stereo pair. In another case, the first playback device may be just any playback device in the consolidated player or stereo pair. In some instances, each playback device in the consolidated player or stereo pair may receive, either directly from a content source, from the primary player, or from some other source, the audio signals (or components of the audio signals) to be rendered by the consolidated player or stereo pair.

Referring back to FIG. 5, block 504 of the method 500 involves determining a first limiting result by applying to a second audio signal a limiting function associated with a second playback device. As indicated above, the second playback device may be a full or mid-high frequency range playback device in the example in connection with FIG. 6A, or a right channel speaker in the example in connection with FIG. 6B. As previously indicated, the limiting function associated with the second playback device may represent an acoustic limit of the second playback device. As such, when applying the limiting function associated with the second playback to the second audio signal, the first playback device generates a model of an audio signal that may be rendered by the second playback device when the second playback device plays the second audio signal.

The first playback device, in order to apply the limiting function associated with the second playback device, has access to the limiting function associated with the second playback device. In one example, the first playback device may receive the limiting function associated with the second playback device when the consolidated player or stereo pair is formed. In another example, the first playback device may receive the limiting function associated with the second playback device when either the first playback device or the second playback device joins the media playback system that the first and second playback devices are parts of. In one case, the limiting function associated with the second playback device may be provided to the first playback device by the second playback device. In another case, the limiting function associated with the second playback device may be provided from a local or remote network device or server.

In some instances, the limiting function associated with the second playback device may be specific to the particular second playback device. In other instances, the limiting function associated with the second playback device may be associated with a production model of the second playback device, such that all playback devices of that production model have the same limiting functions. In such instances, the first playback device may already have stored thereon a particular limiting function associated with the production model of the second playback device and may access the particular limiting function as the limiting function associated with the second playback device.

In some cases, the limiting function associated with the second playback device may be a modified version of the limiting function that the second playback device actually applies when playing audio content. For instance, the limiting function applied by the first playback device may be a simplified version of the limiting function applied by the second playback device when the second playback device is playing audio content to lessen the processing load of the first playback device when executing the block 504. Other examples of limiting functions and limiting function sources are also possible.

Figure 6C:
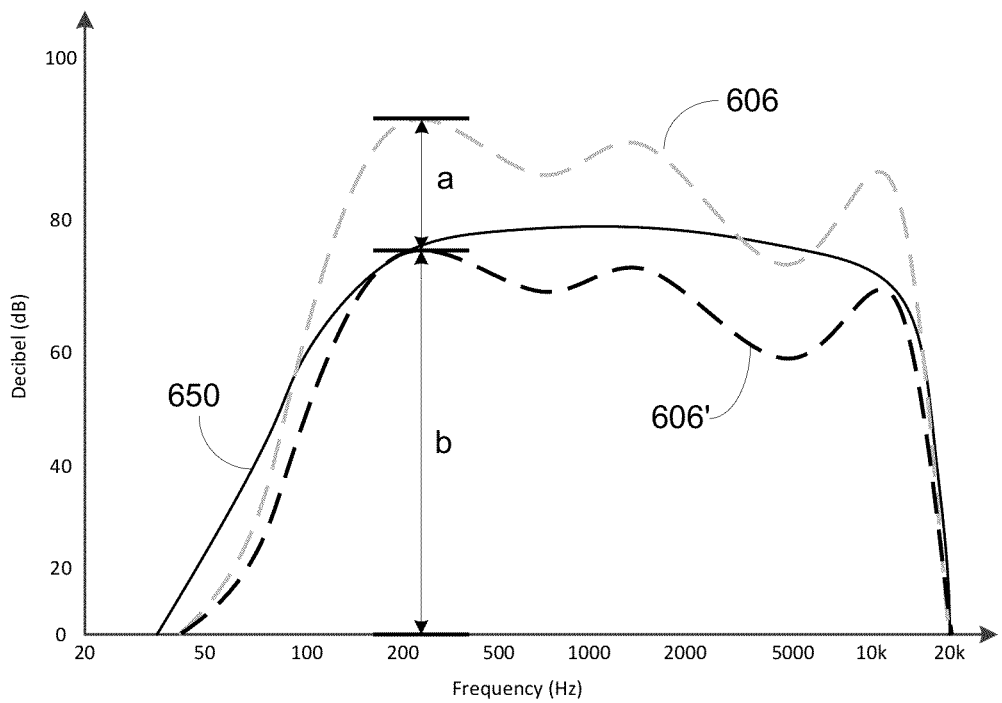

For purposes of illustration, FIG. 6C shows an example application of a limiting function 650 to the second audio signal 606 discussed previously in connection to the example of FIG. 6B. In this example, the limiting function 650 may be the limiting function associated with the second playback device, which as discussed above may be the right channel speaker of the stereo pair. As shown, applying the limiting function 650 results in a limited second audio signal 606' that is a proportionally scaled down version of the second audio signal 606 such that the limited second audio signal 606' is within the acoustic limit of the second playback device as defined by the limiting function 650, across the entire frequency range of the second audio signal 606. As shown in this illustrative example, the first limiting result may indicate that the limited second audio signal 606' is the second audio signal 606 scaled down by a ratio of b/(a+b).

In some cases, the acoustic limit of a playback device may be lower (more limited) towards the lower frequencies of the playback frequency of the playback device. In other words, the ratio by which an audio signal is scaled when applying the limiting function associated with the playback device may be dependent primarily on the lower frequencies of the audio signal. In fact, in some instance, the limiting function may only be provided for lower frequency audio signal anyway. As such, the first playback device may in some embodiments, process the second audio signal such that only the lower frequencies of the second audio signal remain (i.e. using a low-pass filter). Continuing with the examples above, the first playback device may consequently apply the limiting function 650 associated with the second playback device to just the remaining lower frequencies of the second audio signal 606 to determine the first limiting result. In some cases, applying the limiting function 650 to only the lower frequencies of the second audio signal 606 may reduce the overall processing power and processing time of block 504.

Figure 6D:
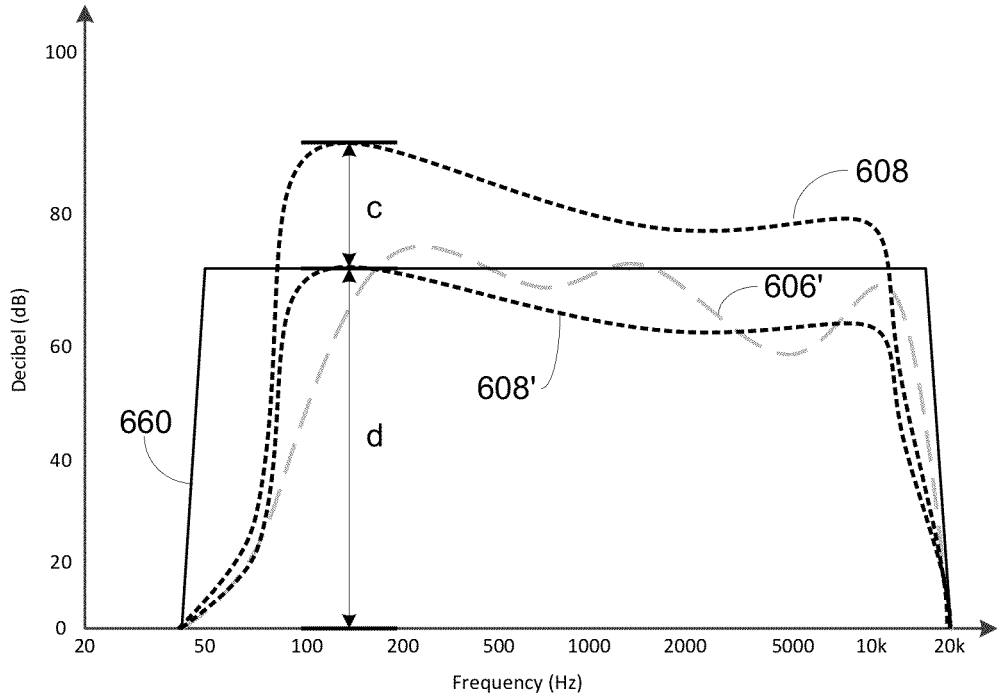

For a balanced output between the playback of the first audio signal 608 by the first playback device and playback of the second audio signal 606 by the second playback device, the first audio signal 608 may need to be limited or proportionally scaled to match that of the limited second audio signal 606' when played by the first playback device. Accordingly, at block 506, the method 500 involves determining a limiting function based on the first limiting result. FIG. 6D shows an example limiting function 660 determined based on the first limiting result discussed above. As shown, the limiting function 660, when applied, may be configured to scale the first audio signal 608 by a ratio of d/(c+d). In this case, for a balanced output between the playback of the first audio signal 608 and the second audio signal 606, d/(c+d)=b/(a+b).

At block 508, the method 500 involves configuring the first playback device to apply the determined limiting function when playing the first audio signal. Referring to FIG. 6D again, the first playback device may be configured to apply the limiting function 660 when playing the first audio signal 608. As shown, a limited first audio signal 608' may be generated when applying the limiting function 660 to the first audio signal 608. The limited first audio signal 608' is proportionally scaled down from the first audio signal 608 by the ratio of d/(c+d). In one example, configuring the first playback device to apply the limiting function 660 to the first audio signal 608 may involve adjusting an amplifier gain applied to the first audio signal 608 by the first playback device. In one case, the amplifier gain may be adjusted to be d/(c+d) of unity gain. As also shown in FIG. 6D, the limited first audio signal 608' and the limited second audio signal 606' are substantially as proportionally balanced as the first audio signal 608 and second audio signal 606 shown in FIG. 6B. Accordingly, when configured to apply the determined limiting function 660, the first playback device may effectively render the limited first audio signal 608' when playing the first audio signal 608. In another example, applying the limiting function 660 to the first audio signal 608 may involve simply capping or clipping the first audio signal 608 according to the limiting function 660, rather than proportionally scaling the first audio signal 608.

In one example, as suggested previously, the first playback device may be a primary playback device in the stereo pair and as such may also be configured to cause and/or coordinate the second playback device to play the second audio signal 606 in synchrony with the playback of the first audio signal 608. In some embodiments, synchronous playback between the first and second playback devices may be performed as described in previously referenced U.S. Pat. No. 8,234,395, also assigned to SONOS, Inc.

As a primary player, the first playback device may be configured to send the second audio signal 606 to the second playback device for the second playback device to play in synchrony with the playback of the first audio signal 608 by the first playback device (while applying the determined limiting function 660). In some embodiments, if the first playback device generated the limited second audio signal 606' when applying the limiting function 650 to the second audio signal 606 to determine the first limiting result in block 504, the first playback device may send the limited second audio signal 606' to the second playback device for the second playback device to render, thereby eliminating the need for the second playback device to apply the limiting function 650 associated with the second device when playing the second audio signal 606. In other embodiments, the first playback device may simply send the audio signal 606 to the second playback device, and the playback device may apply its limiting function 650 to the audio signal 606.

While discussions above relating to the method 500 are generally directed to the balancing of audio output during synchronized playback by a stereo pair, one having ordinary skill in the art will appreciate that method 500 may be applied to other synchronized playback scenarios as well. Further, note that in some embodiments, the illustrative examples discussed in connection to the method 500 and FIG. 6A-6D represent only one instance of a dynamic balancing of audio output during synchronized playback. In other words, method 500 may be performed for each data packet or series of data packets containing audio signals received as part of a streaming audio content.

b. Second Example Method for Audio Output Balancing During Synchronized Playback In the example discussed above in connection to FIG. 5, the first playback device determines a limiting function for the first audio signal to be played by the first device based on the result of applying the limiting function associated with the second playback device to the second audio signal to be played by the second device. This may be the case when the first playback device and the second playback device have similar or comparable acoustic limits, or if the first playback device has a higher acoustic limit than the second playback device. In some cases, however, the limiting function for the first audio signal may be determined based on the result of applying the limiting function associated with the second playback device on the second audio signal as well as a result of applying the limiting function associated with the first playback device on the first audio signal.

Figure 7:
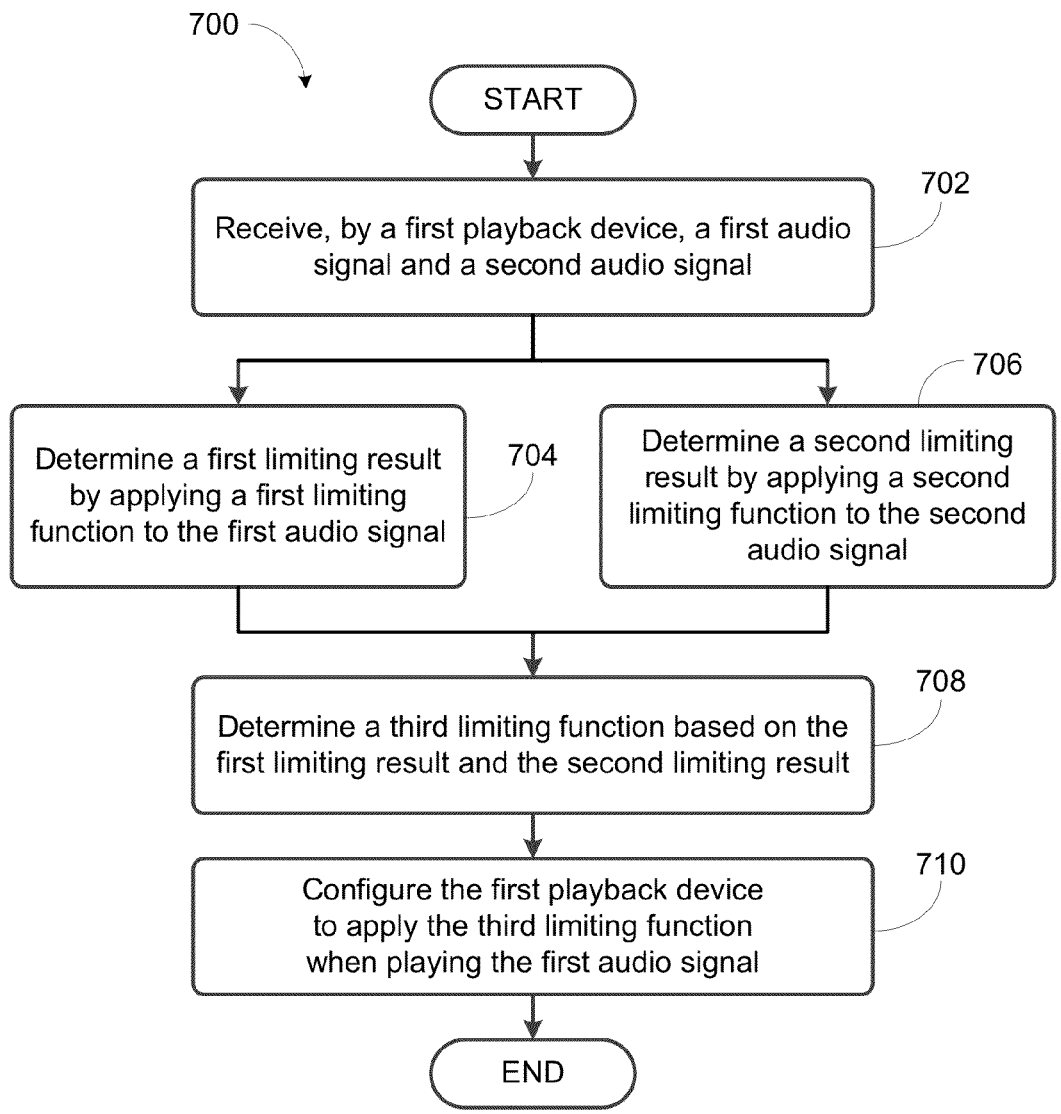
FIG. 7 shows a flow diagram of a second example method for audio output balancing during synchronized playback.

FIG. 7 shows a flow diagram of a second example method 700 for audio output balancing during synchronized playback. Method 700 shown in FIG. 7 presents an embodiment of a method that can be implemented within an operating environment involving, for example, the media playback system 100 of FIG. 1, one or more of the playback device 200 of FIG. 2, and one or more of the control device 300 of FIG. 3. Method 700 may include one or more operations, functions, or actions as illustrated by one or more of blocks 702-710. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

At block 702, the method 700 involves receiving, by a first playback device, a first audio signal and a second audio signal. In one example, as discussed above in connection to the method 500, the first playback device may be configured to play the first audio signal in synchrony with the playback of the second audio signal by a second playback device. Accordingly, in one example, the first and second audio signals may be the audio signals 602 and 604, respectively shown and discussed in connection to FIG. 6A. In one example, the first and second playback devices may be playback devices 104 and 110, respectively shown in FIG. 1. In another example, the first and second audio signals may be the audio signals 608 and 606 respectively shown and discussed in connection to FIG. 6B, and the first and second playback devices may be the playback devices 124 and 122, respectively shown in FIG. 1. Other examples are also possible.

Figure 8A:
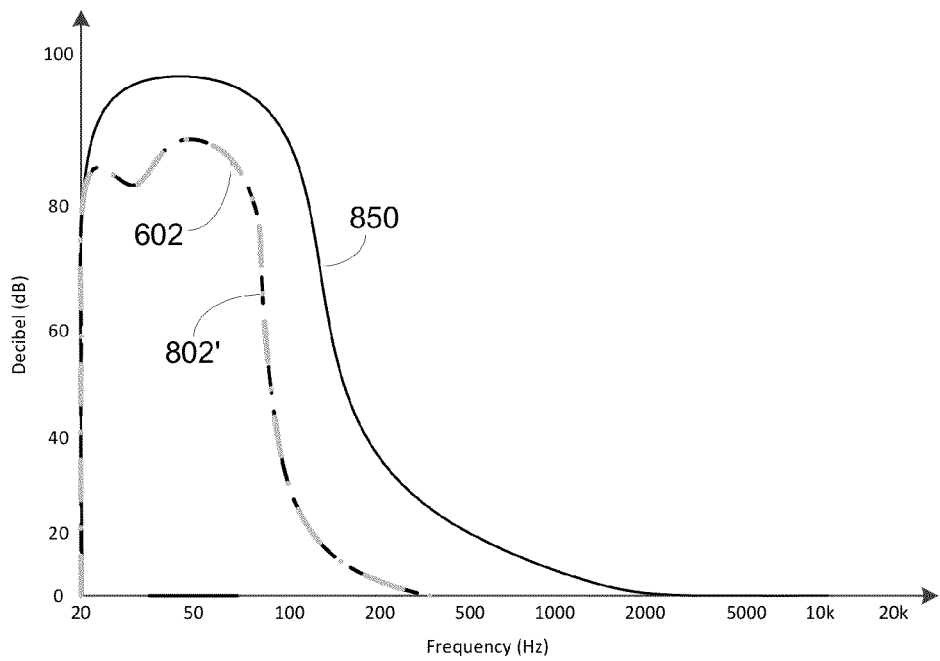
FIGS. 8A-8D show additional example synchronized playback audio signals, example audio limiters, and example limited audio signals.

At block 704, the method 700 involves the first playback device determining a first limiting result by applying a first limiting function to the first audio signal. In this case, the first limiting function may be one that is associated with the first playback device, and may represent an acoustic limit of the first playback device. FIG. 8A shows an example application of a limiting function 850 to the audio signal 602 introduced previously in connection to the example of FIG. 6A. In this example, the limiting function 850 may be the first limiting function associated with the first playback device, and as discussed in connection to block 702, the audio signal 602 may be the first audio signal to be played by the first playback device. Similar to the relevant discussions in connection to block 504 of the method 500, applying the limiting function 850 to the first audio signal 602 may result in a limited first audio signal 802', which is a model of an audio signal that may be rendered by the first playback device when the first playback device plays the first audio signal 602.

In this example, as shown in FIG. 8A, the limited first audio signal 802' and the first audio signal 602 may be the same because the signal value over the entire frequency range of the first audio signal 602 is within the acoustic limit of the first playback device as defined by the limiting function 850. As such, the first limiting result determined by applying the first limiting function 850 to the first audio signal 602 may indicate that no scaling or reduction in gain to the first audio signal 602 is necessary for the first playback device to properly play the first audio signal 602.

Figure 8B:
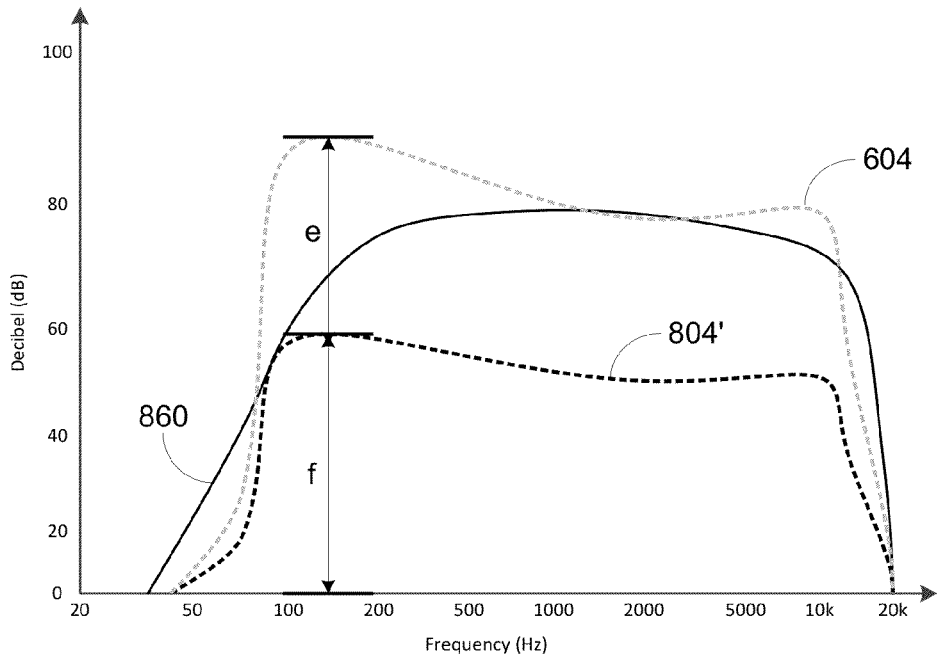

At block 706, the method 700 involves the first playback device determining a second limiting result by applying a second limiting function to the second audio signal. The second limiting function in this example may be associated with the second playback device. As such, block 706 may be similar to block 504 of the method 500, and any discussions above in connection to block 504 may apply to block 706 as well. For instance, the first playback device may be configured to receive the second limiting function prior to determining the second limiting result. FIG. 8B shows an example application of a limiting function 860 to the audio signal 604 discussed previously in connection to the example of FIG. 6A. In this example, the limiting function 860 may be the second limiting function associated with the second playback device, and as discussed in connection to block 702, the audio signal 604 may be the second audio signal to be played by the second playback device. Applying the limiting function 860 to the second audio signal 604 may result in a limited second audio signal 804', which is a model of an audio signal that may be rendered by the second playback device when the second playback device plays the second audio signal 604.

In this example, as shown in FIG. 8B, the limited second audio signal 804' is a proportionally scaled down version of the second audio signal 604 such that the limited second audio signal 804' is within the acoustic limit of the second playback device as defined by the limiting function 860. As shown in this illustrative example, the first limiting result may indicate that the limited second audio signal 804' is the second audio signal 604 scaled down by a ratio of f/(e+f).

At block 708, the method 700 involves the first playback device determining a third limiting function based on the first limiting result and the second limiting result. Similar to that discussed in connection to block 506 of the method 500, one of the first and second audio signals may be limited or proportionally scaled to match the limited result of the other for a balanced output between the playback of the first and second audio signals.

Figure 8C:
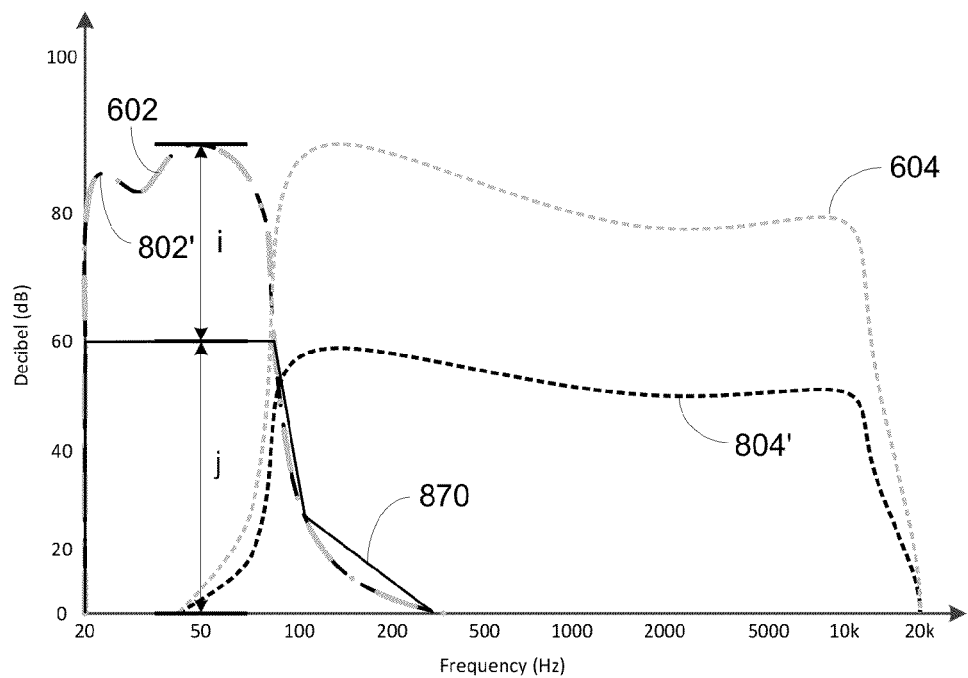

FIG. 8C shows each of the first audio signal 602, the limited first audio signal 802', the second audio signal 604, and the limited second audio signal 804'. As discussed above, and as shown, applying the second limiting function 860 to the second audio signal 604 resulted in a limited second audio signal 804' that was more limited than the limited first audio signal 802' that resulted from applying the first limiting function 850 to the first audio signal 602. Based on the first and second limiting results represented by the limited first audio signal 802' and the limited second audio signal 804', respectively, a third limiting function 870 may be determined such that an application of the third limiting function 870 to the first audio signal 602 results in a balanced output between playback of the first audio signal 602 by the first playback device and playback of the second audio signal 604 by the second playback device. As shown, the limiting function 870, when applied, may be configured to scale the first audio signal 602 by a ratio of $j/(i+j)$ such that $j/(i+j)=f/(e+f)$.

Figure 8D:
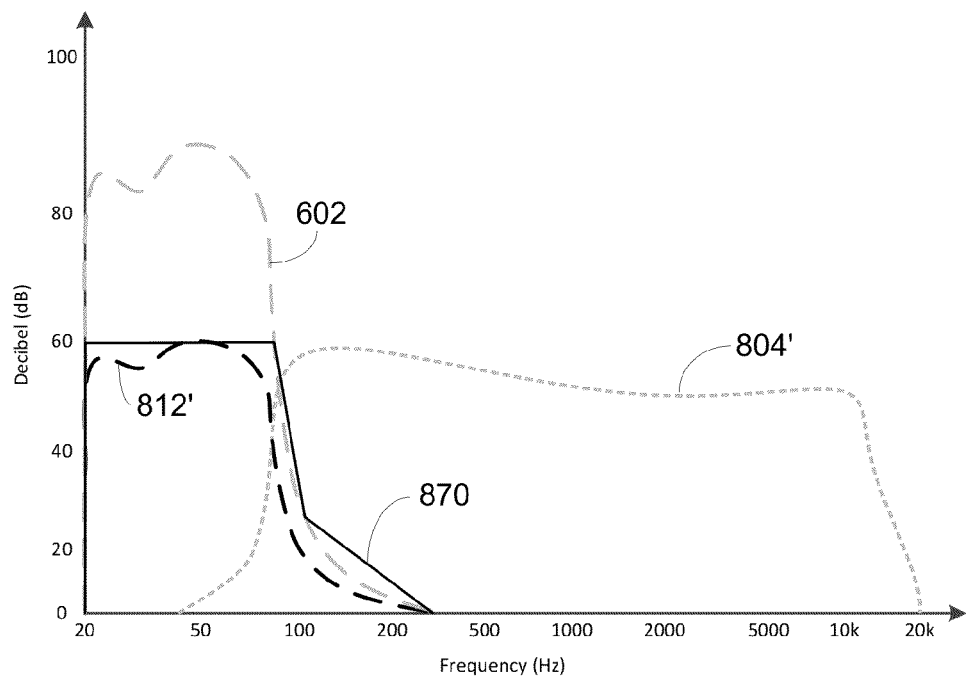

At block 710, the method 700 involves configuring the first playback device to apply the third limiting function when playing the first audio signal. Referring to FIG. 8D, the first playback device may be configured to apply the limiting function 870 to the first audio signal 602 when playing the first audio signal. In one example as shown, application of the third limiting function 870 to the first audio signal 802 may result in a limited first audio signal 812' such that the limited first audio signal 812' is proportionally scaled down from the first audio signal 602 by the ratio of $j/(i+j)$. As discussed above in connection to block 508 of method 500, applying the limiting function 870 to the first audio signal 602 may involve adjusting an amplifier gain applied to the first audio signal 602 by the first playback device. In one case, the amplifier gain may be adjusted to be $j/(i+j)$ of unity gain. As also shown in FIG. 8D, the limited first audio signal 812' and the limited second audio signal 804' are substantially as proportionally balanced as the first audio signal 602 and second audio signal 604 shown in FIG. 6A. In one case, when configured to apply the third limiting function 670, the first playback device may effectively render the limited first audio signal 612' when playing the first audio signal 608. In another example, applying the third limiting function 870 to the first audio signal 802 may involve simply capping or clipping the first audio signal 602 according to the third limiting function 870, rather than proportionally scaling the first audio signal 602.

Synchronous playback of the first audio signal 802 with playback of the second audio signal 604 by the second playback device may be similar to the synchronous playback of the first audio signal 608 by the first playback device and the second audio signal 606 by the second playback device discussed previously in connection to the method 500 of FIG. 5. Along those lines, any previous discussions related to synchronous playback of audio content by two or more playback devices may also be applicable to method 700 and examples discussed in connection to the method 700. Further, while discussions above relating to the method 700 are generally directed to the balancing of audio output during synchronized playback by a consolidated player, one having ordinary skill in the art will appreciate that method 700 may be applied to other synchronized playback scenarios as well. In addition, note that in some embodiments, the illustrative examples discussed in connection to the method 700 and FIG. 8A-8D represent only one instance of a dynamic balancing of audio output during synchronized playback. In other words, method 700 may be performed for each data packet or series of data packets containing audio signals received as part of a streaming audio content.

c. Third Example Method for Audio Output Balancing During Synchronized Playback

In the illustrative examples discussed above in connection to FIGS. 5 and 7, determining a limiting function to be applied to the first audio signal may generally be based on the acoustic limit of a playback device in the stereo pair or consolidated player with the lowest acoustic limit. In other words, the limiting function may be determined such that the output of the first playback device when playing the first audio signal is reduced to substantially match the output of the second playback device when playing the second audio signal if the synchronous playback output of the two playback devices is increased beyond the acoustic limit of the second playback device. In the example discussed in connection to the method 700 and as shown in FIG. 8D, the resulting output volume of the rendered audio signal may be around 60 dB, which is over 20 dB less than the output volume of received audio signal of over 80 dB. In some embodiments, depending on the acoustic limits and capabilities of the first and second playback devices, the reduction in output volume may be reduced by dynamically adjusting a crossover frequency according to which the first playback device plays the first audio signal.

Figure 9:
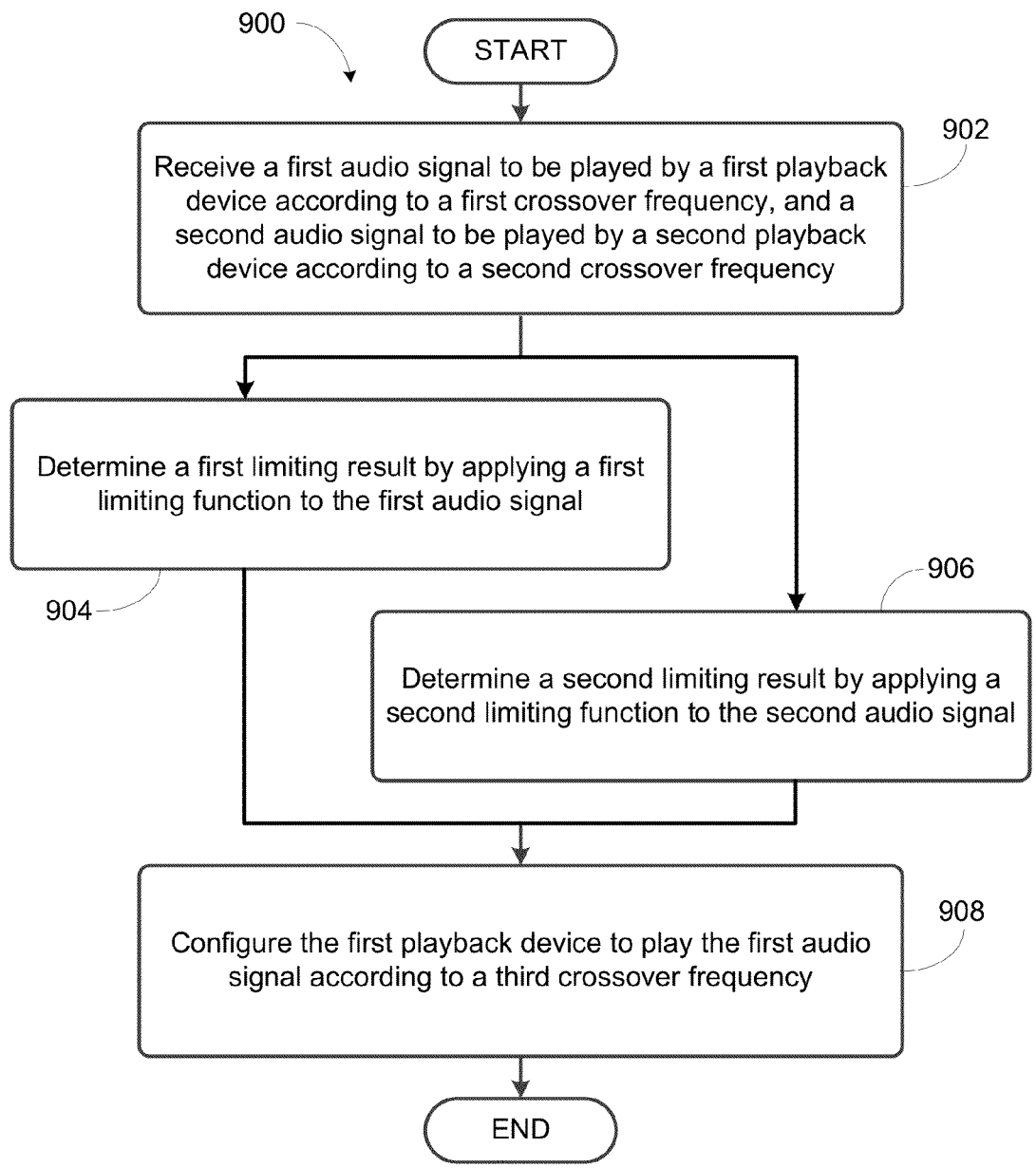
FIG. 9 shows a flow diagram of an example method for adjusting a crossover frequency for audio output balancing during synchronized playback.

FIG. 9 shows a flow diagram of an example method 900 for adjusting a crossover frequency for audio output balancing during synchronized playback. Method 900 shown in FIG. 9 presents an embodiment of a method that can be implemented within an operating environment involving, for example, the media playback system 100 of FIG. 1, one or more of the playback device 200 of FIG. 2, and one or more of the control device 300 of FIG. 3. Method 700 may include one or more operations, functions, or actions as illustrated by one or more of blocks 902-908. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

At block 902, the method 900 involves receiving a first audio signal to be played by a first playback device according to a first crossover frequency, and a second audio signal to be played by a second playback device according to a second crossover frequency. Continuing with the examples above, the first audio signal may be the audio signal 602 shown in FIG. 6A and the first crossover frequency may be the crossover frequency 610 of 80 Hz. Analogously, the second audio signal may be the audio signal 604 and the second crossover frequency may also be the crossover frequency 610 of 80 Hz. As indicated previously, in some cases, the first audio signal 602 and the second audio signal 604 may be different components of an audio content.

In some embodiments, the first audio signal 602 and the second audio signal 604 may be received individually, while in some other embodiments, audio content including both the first audio signal 602 and the second audio signal 604 may be received as a whole, and band-pass filters may be applied to the received audio content to generate the first audio signal 602 and the second audio signal 604. In some cases, the first and second crossover frequencies (in this example, both may be the crossover frequency 610) may be received along with the audio content to generate and apply applicable band-pass filters. In some other cases, the first and second crossover frequencies may be predetermined when the first and second playback devices were configured as a consolidated player based on playback capabilities and configurations of the first and second playback devices. Block 902 may be similar to block 702 discussed above in connection to FIG. 7. Accordingly, any relevant discussions in connection to the method 700 of FIG. 7 may be applicable to block 902 as well.

Figure 10A:
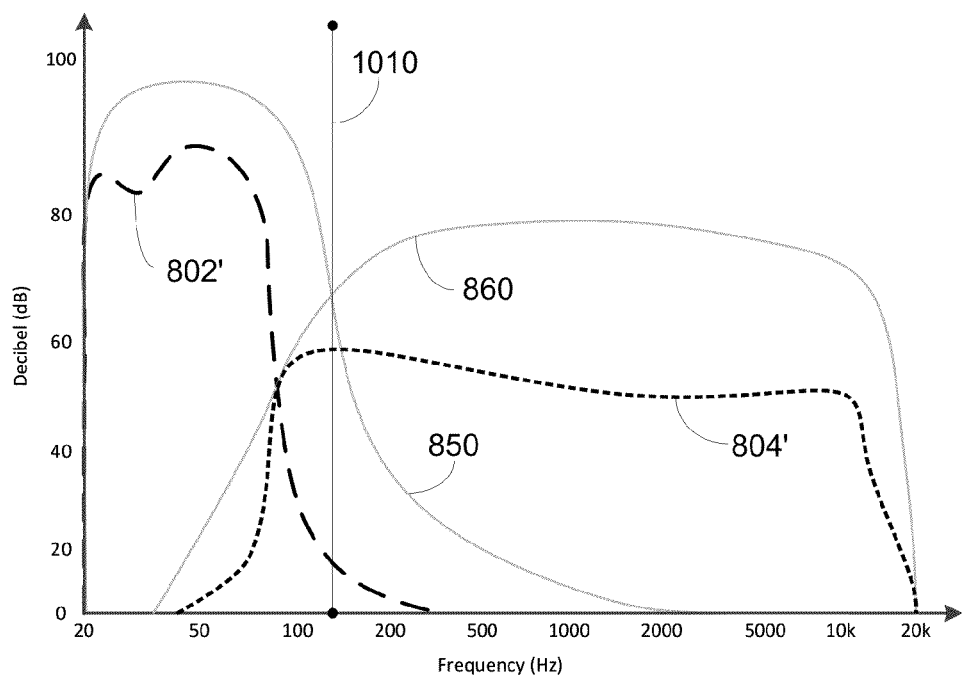
FIGS. 10A-10F show further example synchronized playback audio signals, example audio limiters, and example limited audio signals.

At block 904, the method 900 involves determining a first limiting result by applying a first limiting function to the first audio signal, and at block 906, the method 900 involves determining a second limiting result by applying a second limiting function to the second audio signal. Similar to blocks 704 and 706, respectively, and continuing with the above examples, the first limiting function may be the limiting function 850 that is associated with the first playback device, and the second limiting function may be the limiting function 860 that is associated with the second playback device, shown previously in FIGS. 8A and 8B, respectively. As shown in FIG. 10A, the first limiting result determined from applying the first limiting function 850 to the first audio signal 602 may include the limited first audio signal 802', and the second limiting result determined from applying the second limiting function 860 to the second audio signal 604 may include the limited second audio signal 804'. As blocks 904 and 906 are similar to blocks 704 and 706, respectively, any relevant discussions in connection to the method 700 of FIG. 6 may be application to blocks 904 and 906 as well.

At block 908, the method 900 involves configuring the first playback device to play the first audio signal according to a third crossover frequency. Configuring the first playback device to play the first audio signal according to the third crossover frequency may involve first determining the third crossover frequency. In one example, the third crossover frequency may be determined based on the first limiting result and the second limiting result. For instance, the third crossover frequency may be determined based on frequencies at which the second playback device is limited, and determining whether the first playback device is capable of playing audio content in those frequencies. In the example shown in FIG. 10A, the example third crossover frequency 1010 may be determined to be the highest frequency at which the first playback device can render audio content of a satisfactory acoustic quality and/or output volume. As suggested above, this may be the case when the second audio signal 604 was more limited by the limiting function 860 towards the lower end of the mid-high frequency range. In this example, the example third crossover frequency 1010 may be 150 Hz.

Figure 10B:
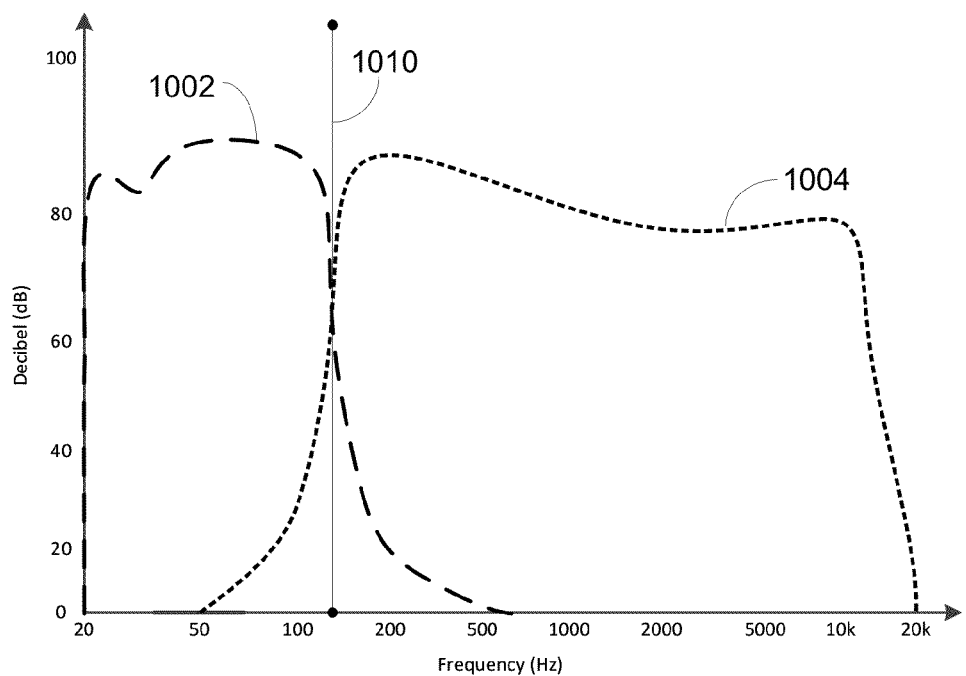

FIG. 10B shows an example first audio signal 1002 that may be played by the first playback device according to the third crossover frequency 1010 of 150 Hz. In this case, audio content including both the first audio signal 602 and the second audio signal 604 may be received by the first playback device. Subsequently, the first playback device may apply band-pass filters to the received audio content according to the third crossover frequency 1010 to generate the first audio signal 1004 to be played by the first playback device. As indicated above, the first playback device may be configured to play the first audio signal 602 in synchrony with playback of the second audio signal 604. As such, the second playback device may be configured to play the second audio signal 604 according to a fourth crossover frequency that may be determined based on the third crossover frequency and/or the first and second limiting results from blocks 904 and 906. FIG. 10B also shows an example second audio signal 1004 that may be played by the second playback device according to the fourth crossover frequency, which in this example may also be 150 Hz, same as the third crossover frequency 1010.

In one example, the first playback device may be configured to send to the second playback device, data indicating the third crossover frequency, and configuring, or causing the second playback device to be configured to play the second audio signal according to the fourth crossover frequency. In this case, the second playback device may be configured to determine the fourth crossover frequency based on the third crossover frequency. In the case the second playback device receives the audio content including both the first audio signal 602 and the second audio signal 604, the second playback device may be configured to apply band-pass filters according to the fourth crossover frequency to generate the second audio signal 1004 to be played by the second playback device. As indicated previously, the fourth crossover frequency may in some cases be the same as the third crossover frequency 1010 of 150 Hz.

In another example, the first playback device may be configured to determine the fourth crossover frequency based on the third crossover frequency, and send to the second playback device, data indicating the fourth crossover frequency. In this case the second playback device may be configured to apply band-pass filters according to the fourth crossover frequency 1010 to generate the second audio signal 1004 to be played without having to determine the fourth crossover frequency itself.

Playback of the first audio signal 1002 by the first playback device in synchrony with playback of the second audio signal 1004 by the second playback device may result in a more balanced output than playback of the first audio signal 602 by the first playback device in synchrony with playback of the second audio signal 604 by the second playback device. In some embodiments, the dynamic adjustment of crossover frequencies may result in sufficient audio output balancing during synchronized playback. In some other embodiments, however, additional steps, such as those described in connection to FIGS. 5 and 7 may be performed to further balance audio output by the first and second playback devices during synchronous playback. For illustration purposes, FIGS. 10C-10E show an example application of the method 700 of FIG. 7 to the first audio signal 1002 and the second audio signal 1004 of FIG. 10B.

Figure 10C:
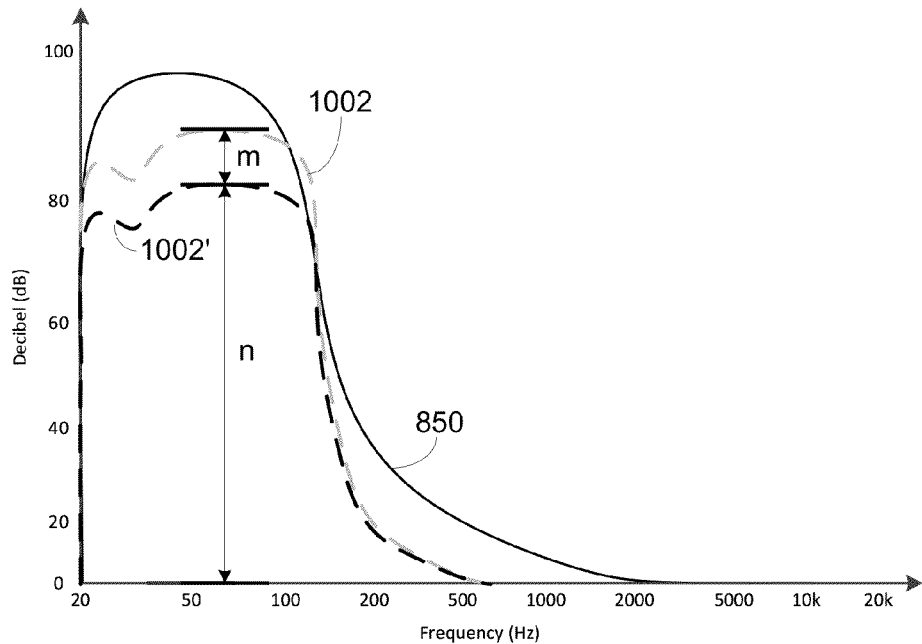
Figure 10D:
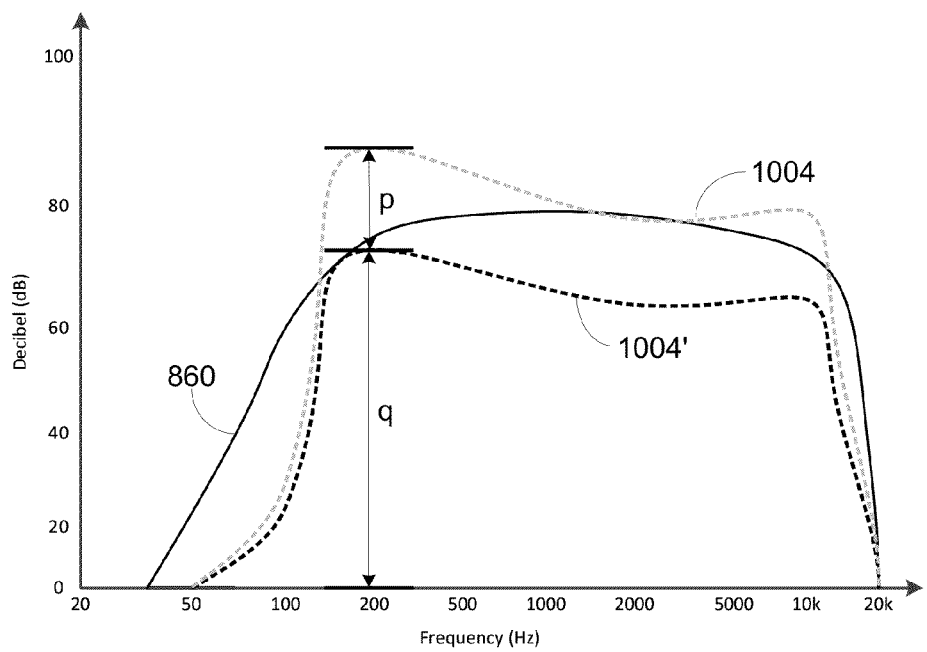

As shown in FIG. 10C, the first limiting function 850 may be applied to the first audio signal 1002. In this example, the limiting result may indicate that a limited first audio signal 1002' generated from applying the first limiting function 850 to the first audio signal 1002 is the first audio signal 1002 scaled down by a ratio of n/(m+n). As shown in FIG. 10D, the second limiting function 860 may be applied to the second audio signal 1004. In this example, the limiting result may indicate that a limited second audio signal 1004' generated from applying the second limiting function 860 to the second audio signal 1004 is the second audio signal 1004 scaled down by a ratio of q/(p+q).

As indicated previously, one of the first audio signal 1002 and second audio signal 1004 may need to be limited or proportionally scaled to match the limited result of the other for a balanced output between the playback of the first audio signal 1002 by the first playback device and playback of the second audio signal 1004 by the second playback device. Comparing n/(m+n) and q/(p+q) as shown in FIGS. 10C and 10D, applying the second limiting function 860 to the second audio signal 1004 resulted in a limited second audio signal 1004' that was more limited than the limited first audio signal 1002' that results from applying the first limiting function 850 to the first audio signal 1002. In other words q/(p+q) is less than n/(m+n) in this example.

Figure 10E:
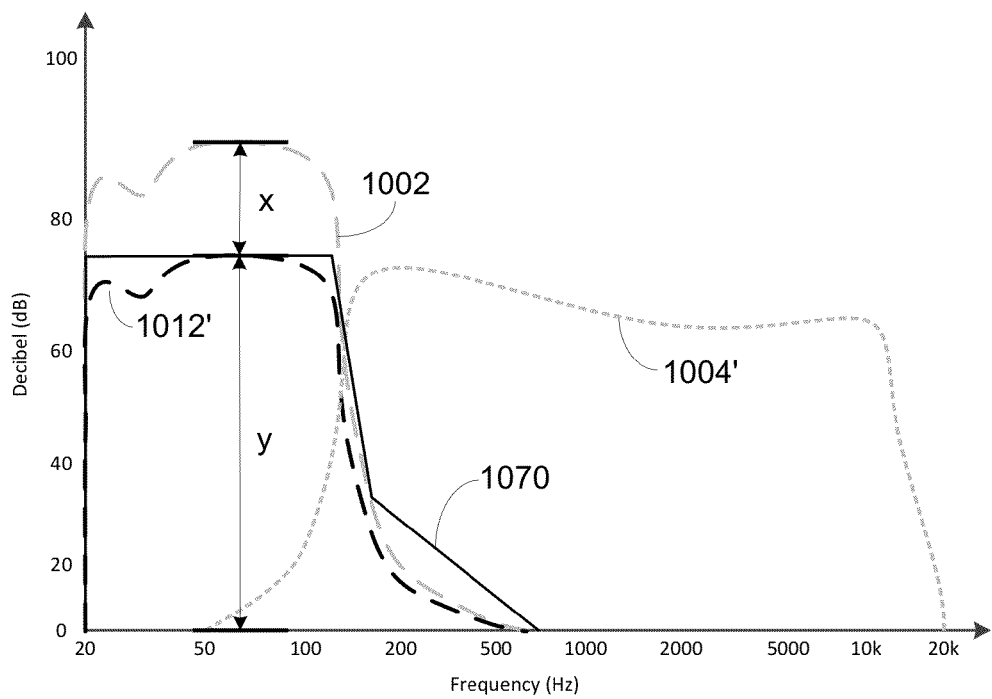

Accordingly, as shown in FIG. 10E, a limiting function 1070 may be determined such that an application of the limiting function 1070 to the first audio signal 1002 results in a balanced output between playback of the first audio signal 1002 by the first playback device and playback of the second audio signal 1004 by the second playback device. As shown, the limiting function 1070, when applied, may be configured to scale the first audio signal 1002 by a ratio of y/(x+y) such that y/(x+y)=q/(p+q).

Figure 10F:
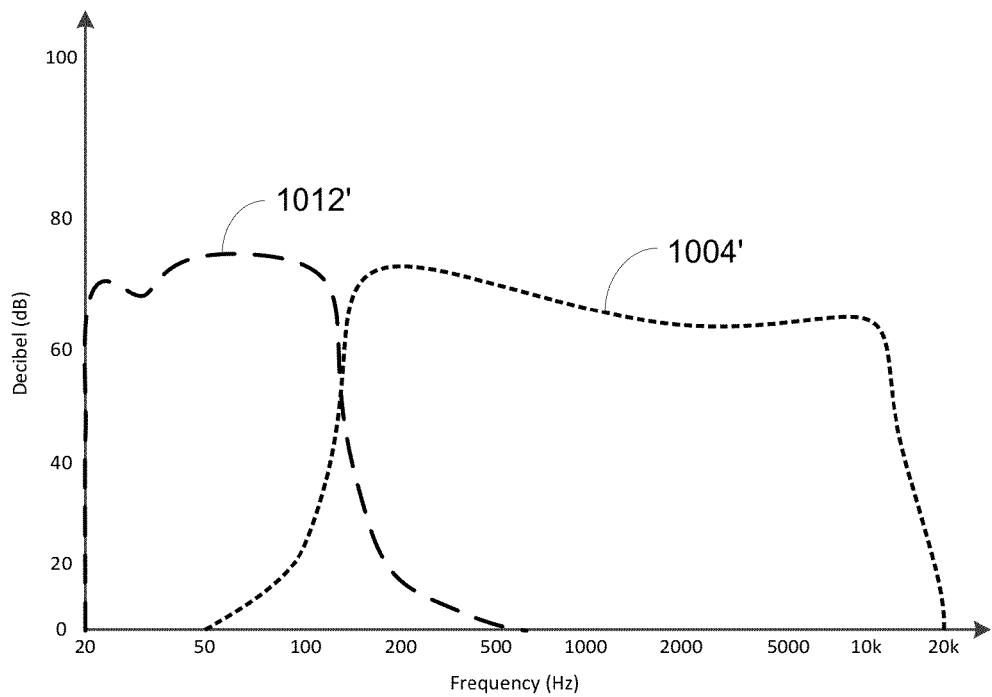

The first playback device may accordingly be configured to apply the limiting function 1070 when playing the first audio signal 1002. As shown, a limited first audio signal 1012' generated when applying the limiting function 1070 to the first audio signal 1002 is proportionally scaled down from the first audio signal 1002 by the ratio of y/(x+y). As indicated previously, applying the limiting function 1070 to the first audio signal 1002 may involve adjusting an amplifier gain applied to the first audio signal 1002 by the first playback device. As shown in FIG. 10F, the limited first audio signal 1012' and the limited second audio signal 1004' are substantially as proportionally balanced as the first audio signal 602 and second audio signal 602 shown in FIG. 6A. As indicated previously, in some cases, applying the limiting function 1070 to the first audio signal 1002 may involve simply capping or clipping the first audio signal 1002 according to the limiting function 1070, rather than proportionally scaling the first audio signal 1002.

When compared to the limited first and second audio signals 812' and 804' shown in FIG. 8D, the limited modified first and second audio signals 1012' and 1004', as shown in FIG. 10F may be rendered at a balanced output volume of over 70 dB, which is less reduced from the output volume of 80 dB of the first and second audio signals 602 and 604 than the balanced output volume of around 60 dB if rendering the limited first and second audio signals 812' and 804'.

While discussions above relating to the method 900 are generally directed to the balancing of audio output during synchronized playback by a consolidated player, one having ordinary skill in the art will appreciate that method 900 may be applied to other synchronized playback scenarios as well. In addition, note that in some embodiments, the illustrative examples discussed in connection to the method 900 and FIG. 10A-10F represent only one instance of a dynamic balancing of audio output during synchronized playback. In other words, method 900 may be performed for each data packet or series of data packets containing audio signals received as part of a streaming audio content. Other examples are also possible.

IV. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

As indicated above, the present application involves balancing of outputs from playback devices playing audio content in synchrony. In one aspect, a first playback device is provided. The first playback device includes a processor, and memory having stored thereon instructions executable by the processor to cause the first playback device to perform functions. The functions include receiving a first audio signal. The first playback device is configured to play the first audio signal according to a first crossover frequency. The functions also include determining a first limiting result by applying a limiting function to a second audio signal. The second audio signal is configured for playback by a second playback device according to a second crossover frequency, and the limiting function is associated with the second playback device. The functions further include, based on the first limiting result, configuring the first playback device to play the first audio signal according to a third crossover frequency.

In another aspect, a method is provided. The method involves receiving, by a first playback device, audio content comprising a first audio signal and a second audio signal. The first playback device is configured to play the first audio signal according to a first crossover frequency in synchrony with the playback of the second audio signal according to a second crossover frequency by a second playback device. The method also involves determining a first limiting result by applying, by the first playback device, a first limiting function to the first audio signal. The first limiting function is associated with the first playback device. The method further involves determining a second limiting result by applying, by the first playback device, a second limiting function to the second audio signal. The second limiting function is associated with the second playback device. The method also involves, based on the first limiting result and the second limiting result, configuring the first playback device to play the first audio signal according to a third crossover frequency.

In yet another aspect, a non-transitory computer readable memory is provided. The non-transitory computer readable memory has stored thereon instructions executable by a computing device to cause the computing device to perform functions. The functions include receiving a first audio signal. The first playback device is configured to play the first audio signal according to a first crossover frequency. The functions also include determining a first limiting result by applying a limiting function to a second audio signal. The second audio signal is configured for playback by a second playback device according to a second crossover frequency, and the limiting function is associated with the second playback device. The functions further include, based on the first limiting result, configuring the first playback device to play the first audio signal according to a third crossover frequency.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

We claim:

1. A first playback device comprising:
a processor; and
memory having stored thereon instructions executable by the processor to cause the first playback device to perform functions comprising:
receiving a first audio signal, wherein the first playback device is configured to play the first audio signal according to a first crossover frequency;

determining a first limiting result that represents playback of a second audio signal by a second playback device by applying, to the second audio signal, a pre-determined volume-limiting function that is associated with the second playback device, wherein the second playback device is configured to playback the second audio signal according to a second crossover frequency, and wherein the first limiting result indicates frequencies at which a playback volume of the second playback device is limited determining a third crossover frequency based on the indicated frequencies at which the playback volume of the second playback device is limited, wherein the third crossover frequency is higher than the first crossover frequency; and configuring the first playback device to play the first audio signal according to the third crossover frequency.

2. The first playback device of claim 1, wherein the first audio signal and second audio signal are first and second audio components, respectively, of an audio content, and wherein the first playback device is configured to play the first audio signal in synchrony with a playback of the second audio signal by the second playback device.

3. The first playback device of claim 1, wherein the functions further comprise:
playing the first audio signal according to the third crossover frequency in synchrony with a playback of the second audio signal by the second playback device.

4. The first playback device of claim 1, wherein the functions further comprise:
sending to the second playback device data indicating the third crossover frequency; and
configuring the second playback device to play the second audio signal according to a fourth crossover frequency, wherein the fourth-crossover frequency is determined based on the third crossover frequency.

5. The first playback device of claim 1, wherein the functions further comprise:
determining a fourth crossover frequency based on the third crossover frequency and the second audio signal;
sending to the second playback device data indicating the fourth crossover frequency; and
configuring the second playback device to play the second audio signal according to the fourth crossover frequency.

6. The first playback device of claim 1, wherein the functions further comprise:
prior to determining the first limiting result, receiving the pre-determined volume-limiting function associated with the second playback device.

7. The first playback device of claim 1, wherein the first audio signal comprises content in a first frequency range, and wherein the second audio signal comprises content in a second frequency range different from the first frequency range.

8. The playback device of claim 1, wherein determining the third crossover frequency comprises determining a third crossover frequency that is higher than (a) the first crossover frequency and (b) at least a portion of the indicated frequencies at which the playback volume of the second playback device is limited.

9. A method comprising:
receiving, by a first playback device, audio content comprising a first audio signal and a second audio signal, wherein the first playback device is configured to play the first audio signal according to a first crossover frequency in synchrony with the playback of the second audio signal according to a second crossover frequency by a second playback device;

determining, by the first playback device, a first limiting result that represents playback of a first audio signal by the first payback device by applying, to the first audio signal, a first pre-determined volume-limiting function that is associated with the first playback device;

determining, by the first playback device, a second limiting result that represents playback of a second audio signal by a second payback device by applying, to the second audio signal, a second pre-determined volume-limiting function that is associated with the second playback device, wherein the second limiting result indicates frequencies at which a playback volume of the second playback device is limited; and determining a third crossover frequency based on the indicated frequencies at which the playback volume of the second playback device is limited, wherein the third crossover frequency is higher than the first crossover frequency, and wherein the first limiting result indicates that the first playback device is less limited at the frequencies at which the playback volume of the second playback device is limited; and configuring the first playback device to play the first audio signal according to the third crossover frequency.

10. The method of claim 9, further comprising:
playing the first audio signal according to the third crossover frequency in synchrony with a playback of the second audio signal by the second playback device.

11. The method of claim 9, further comprising:
sending to the second playback device data indicating the third crossover frequency; and
configuring the second playback device to play the second audio signal according to a fourth crossover frequency, wherein the fourth crossover frequency is determined based on the third crossover frequency.

12. The method of claim 9, further comprising:
determining a fourth crossover frequency based on the third crossover frequency and the second audio signal;
sending to the second playback device data indicating the fourth crossover frequency; and
configuring the second playback device to play the second audio signal according to the fourth crossover frequency.

13. The method of claim 9, further comprising:
prior to determining the first limiting result, receiving the second pre-determined volume-limiting function associated with the second playback device.

14. The method of claim 9, wherein the first audio signal comprises content in a first frequency range, and wherein the second audio signal comprises content in a second frequency range different from the first frequency range.

15. The method of claim 9, wherein determining the third crossover frequency comprises determining a third crossover frequency that is higher than (a) the first crossover frequency and (b) at least a portion of the indicated frequencies at which the playback volume of the second playback device is limited.

16. A non-transitory computer-readable medium having stored thereon instructions executable by a first playback device to cause the first playback device to perform functions comprising:
receiving a first audio signal, wherein the first playback device is configured to play the first audio signal according to a first crossover frequency;

determining a first limiting result that represents playback of a second audio signal by a second playback device by applying, to the second audio signal, a pre-determined volume-limiting function that is associated with the second playback device, wherein the second playback device is configured to playback the second audio signal according to a second crossover frequency, and wherein the first limiting result indicates frequencies at which a playback volume of the second playback device is limited;

determining a third crossover frequency based on the indicated frequencies at which the playback volume of the second playback device is limited, wherein the third crossover frequency is higher than the first crossover frequency; and configuring the first playback device to play the first audio signal according to the third crossover frequency.

17. The non-transitory computer-readable medium of claim 16, wherein the first audio signal and second audio signal are first and second audio components, respectively, of an audio content, and wherein the first playback device is configured to play the first audio signal in synchrony with a playback of the second audio signal by the second playback device.

18. The non-transitory computer-readable medium of claim 16, wherein the functions further comprise:

playing the first audio signal according to the third crossover frequency in synchrony with a playback of the second audio signal by the second playback device.

19. The non-transitory computer-readable medium of claim 16, wherein the functions further comprise:

sending to the second playback device data indicating the third crossover frequency; and configuring the second playback device to play the second audio signal according to a fourth crossover frequency, wherein the fourth crossover frequency is determined based on the third crossover frequency.

20. The non-transitory computer-readable medium of claim 16, wherein the functions further comprise:

determining a fourth crossover frequency based on the third crossover frequency and the second audio signal;

sending to the second playback device data indicating the fourth crossover frequency; and configuring the second playback device to play the second audio signal according to the fourth crossover frequency.

21. The non-transitory computer-readable medium of claim 16, wherein the functions further comprise:

prior to determining the first limiting result, receiving the pre-determined volume-limiting function associated with the second playback device.

22. The non-transitory computer-readable medium of claim 16, wherein the first audio signal comprises content in a first frequency range, and wherein the second audio signal comprises content in a second frequency range different from the first frequency range.

23. The non-transitory computer-readable medium of claim 16, wherein determining the third crossover frequency comprises determining a third crossover frequency that is higher than (a) the first crossover frequency and (b) at least a portion of the indicated frequencies at which the playback volume of the second playback device is limited.

* * * * *